United States Patent [19]
Fischer et al.

[11] Patent Number: 5,768,695
[45] Date of Patent: Jun. 16, 1998

[54] APPARATUS AND METHOD FOR PROVIDING A FLEXIBLE RAMP UP AND RAMP DOWN OF THE SECTIONS OF A RADIO IN A WIRELESS LOCAL AREA NETWORK

[75] Inventors: Matthew Fischer, Mountain View; Dennis Lee, San Jose, both of Calif.

[73] Assignee: Advanced Micro Devices, Inc., Sunnyvale, Calif.

[21] Appl. No.: 519,262

[22] Filed: Aug. 25, 1995

[51] Int. Cl.$^6$ .............................. H04B 1/16; H04Q 3/02
[52] U.S. Cl. ..................... 455/127; 455/557; 455/38.3
[58] Field of Search ........................... 455/127, 343, 455/344, 38.3, 38.1, 63, 50.1, 119, 116, 89, 54.1, 54.2, 552, 556, 557, 558; 330/51, 202, 297

[56] References Cited

U.S. PATENT DOCUMENTS

| | | | |
|---|---|---|---|
| 4,992,753 | 2/1991 | Jenson et al. | 455/116 |
| 5,276,917 | 1/1994 | Vanhanen et al. | 455/127 |
| 5,287,384 | 2/1994 | Avery et al. | |
| 5,349,697 | 9/1994 | Pelkonen | 455/89 |
| 5,392,457 | 2/1995 | Davis et al. | 455/343 |
| 5,404,374 | 4/1995 | Mullins et al. | |
| 5,488,356 | 1/1996 | Martinovich et al. | 455/38.1 |
| 5,551,067 | 8/1996 | Hulkko et al. | 455/127 |
| 5,553,314 | 9/1996 | Grube et al. | 455/54.2 |

FOREIGN PATENT DOCUMENTS

WO94/17606  8/1994  WIPO.

OTHER PUBLICATIONS

Links, C., Diepstraten, W., Hayes, V., "Universal Wireless LANs", BYTE, May 19, 1994, pp. 99–100, 102, 104, 106, 108.

Primary Examiner—Reinhard J. Eisenzopf
Assistant Examiner—Lester G. Kincaid
Attorney, Agent, or Firm—Sawyer & Associates

[57] ABSTRACT

An apparatus for ensuring that creating the necessary control signalling of multiple implementations of the power ramp operation of a radio transmitter as described. The apparatus provides for a flexible ramp up and ramp down to a plurality of sections of a radio in a wireless local area network. The apparatus includes a plurality of control pins, and a user programmable device for configuring the control pins to provide programmable ramp up and ramp down signals to the plurality of sections of the radio. Accordingly, it is possible to program the ramp up and ramp down function of the radio. The apparatus also ensures that a radio in a wireless local area network does not inappropriately enter into an active state. The apparatus utilizes the user programmable device to configure the control pins to ensure that a signal and its complementary signal are both provided to the radio to ensure that the appropriate signal is utilized to activate the radio.

15 Claims, 5 Drawing Sheets

APPARATUS AND METHOD FOR PROVIDING A FLEXIBLE RAMP UP AND RAMP DOWN OF THE SECTIONS OF A RADIO IN A WIRELESS LOCAL AREA NETWORK

FIELD OF THE INVENTION

The present invention relates to flexible radio power ramp control, and more particularly to a flexible interface for creating the necessary control signalling of multiple implementations of the power ramp operation of a radio transmitter.

BACKGROUND OF THE INVENTION

Most networks are organized as a series of layers, each one built upon its predecessor. The purpose of each layer is to offer services to the higher layers, shielding those layers from implementation details. Between each pair of adjacent layers there is an interface that defines those services.

The International Standards Organization has developed a layered network architecture called the Open Systems Interconnection (OSI) Reference model that has seven protocol layers: application, presentation, session, transport, network, data link, and physical.

The function of the lowest level, the physical layer, is to transfer bits over a communication medium. The function of the data link layer is to partition input data into data frames and transmit the frames over the physical layer sequentially. Each data frame includes a header that contains control and sequence information for the frames.

The interface between the data link layer and the physical layer includes a medium access control device, called a MAC device, and physical layer signaling control device, called a PHY device. The purpose of a MAC device and the PHY device is to ensure two network stations are communicating with the correct frame format and protocol.

In wireless local area networks (WLANs), a radio is the physical device, and free space is the physical communications medium. IEEE 802.11 is a proposed standard for WLANs that defines the communication protocol between a MAC device and a radio, the PHY device. WLAN data communication protocol requires that each data frame transferred between the MAC device and the PHY device have a PHY header, a MAC header, MAC data, and error checking fields. The PHY header includes a preamble that is used to indicate the presence of a signal, unique words, frame length, etc. The MAC header includes frame control, duration, source and destination address, and data sequence number, etc.

Portable radio-based communications systems are built with radio-control logic that determines the sequence and timing of the application and removal of power to and from various portions of the radio's transmitter circuitry. This sequencing is hereinafter referred to as "power ramp-up and power ramp-down sequencing". This transmitter can cause spurious emissions of energy that lie outside of the FCC-mandated spectral density envelope, thereby preventing such a product from passing FCC rule-testing and thence preventing such a product from being granted a license to be operated.

There is no established standard radio interface for portable radio-based communications systems. This means that the control logic built to perform the power-ramp control for one vendor's radio might not correctly perform this function for another vendor's radio. The following invention relates to the creation of an interface that can be used to control the power ramp function for various radios.

Accordingly, what is needed is a flexible MAC interface that provides compatibility between a MAC device and a radio, regardless of the power ramp-up and power ramp-down requirements of the radio. The present invention addresses such a need.

SUMMARY OF THE INVENTION

An apparatus for providing a flexible ramp up and ramp down to a plurality of sections of a radio in a wireless local area network is disclosed. In a first aspect, the apparatus includes a plurality of control pins, and a user programmable device for configuring the control pins to provide programmable ramp up and ramp down signals to the plurality of sections of the radio.

In another aspect, an apparatus for ensuring that a radio in a wireless local area network does not inappropriately enter in a default state is used, which includes a plurality of control pins, and a user programmable device for configuring the control pins to ensure that a signal and its complementary signal are both provided to the radio. The apparatus in accordance with the present invention allows for the use of a variety of radios in a wireless local area network environment.

DETAILED DESCRIPTION

The present invention relates to an improvement in flexible interfaces for creating the necessary control signalling of multiple implementations of the power ramp operation of a radio transmitter. The following description is presented to enable one of ordinary skill in the art to make and use the invention and is provided in the context of a patent application and its requirements. Various modifications to the preferred embodiment and the generic principles and features described herein will be readily apparent to those skilled in the art.

Proposed IEEE standard 802.11 defines several frame formats for transferring data between a MAC device and a radio called the physical layer convergence procedure (PLCP). The PLCP frame formats provides for the asynchronous transfer of MAC layer information from any transmitting station to all receiving stations within a WLAN.

Figure 1:
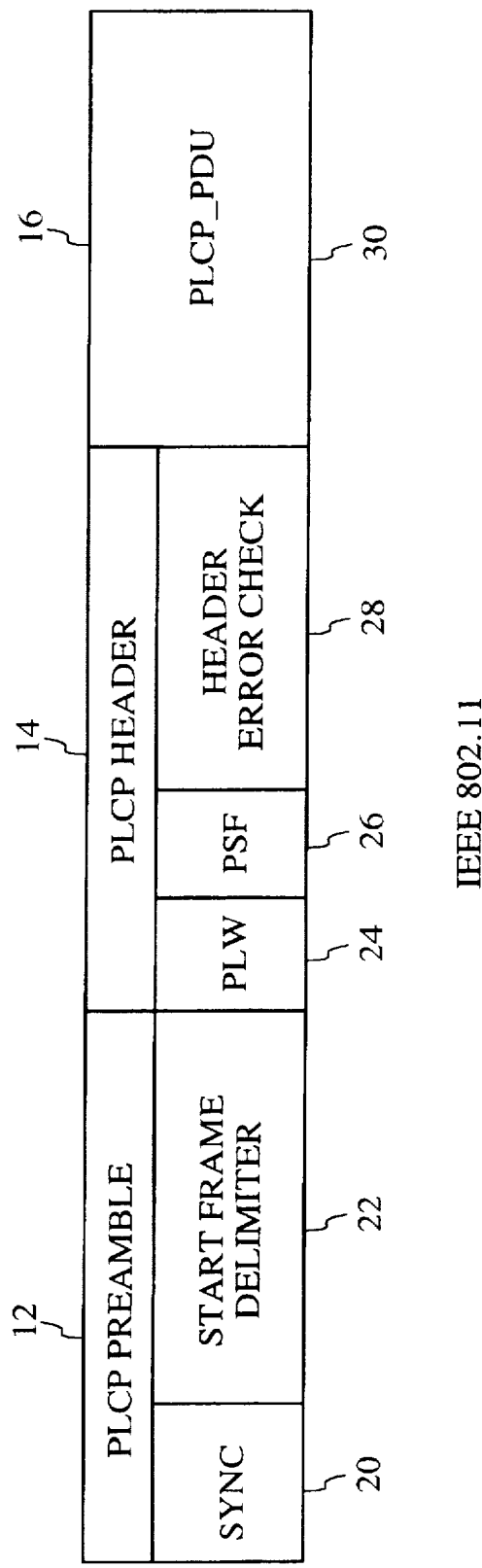
FIG. 1 is a block diagram depicting on PLCP frame format 10 defined by proposed IEEE standard 802.11 "Frequency Hopping Spread Spectrum Physical Layer Specification".

FIG. 1 is a block diagram depicting a PLCP frame format 10 defined by proposed IEEE standard 802.11 "Frequency Hopping Spread Spectrum Physical Layer Specification". The present invention can work with any frequency hopping radios, direct sequence radios, or infrared radios, but frequency hopping frame format is used as an example to more clearly illustrate the principles being disclosed. Accordingly, many types of radios may be utilized and their use would be within the spirit and scope of the present invention. The PLCP frame 10 comprises three parts: a PLCP preamble 12, a PLCP header 14, and a PLCP protocol data unit (PDU) 16. The PLCP preamble 12 includes two subfields, the sync field 20 and the start frame delimiter 22. The sync field 20 is used by the radio to detect a signal to receive, and to reach steady state frequency offset correction and synchronization. The start frame delimiter 22 is used to indicate the end of PLCP preamble and beginning of PLCP header.

The PLCP header 14 includes three subfields, a PLCP length word (PLW) 24, a PLCP signaling field (PSF) 26, and PLCP header error check (HEC) field 28. The PLW 24 indicates the number of octets contained in the PLCP-PDU 16. The PSF 26 indicates the bit rate of the PLCP-PDU 16, and the HEC field 28 is used to detect transmission errors in the PLCP-PDU 16. As used herein, the PLCP-PDU 16 will be referred to as MAC data.

Draft standard IEEE 802.11 suggests that the PLCP preamble 12 should be generated by the physical device, which in WLANs, is the radio. Generating the PLCP preamble 12, however, generally involves digital operations, while radios are mostly analog devices. Therefore, analog-only radios require that the MAC device generate the PLCP preamble 12, since a MAC device performs digital operations. Some PHY implementations, however, may incorporate digital logic that performs this function.

Figure 2:
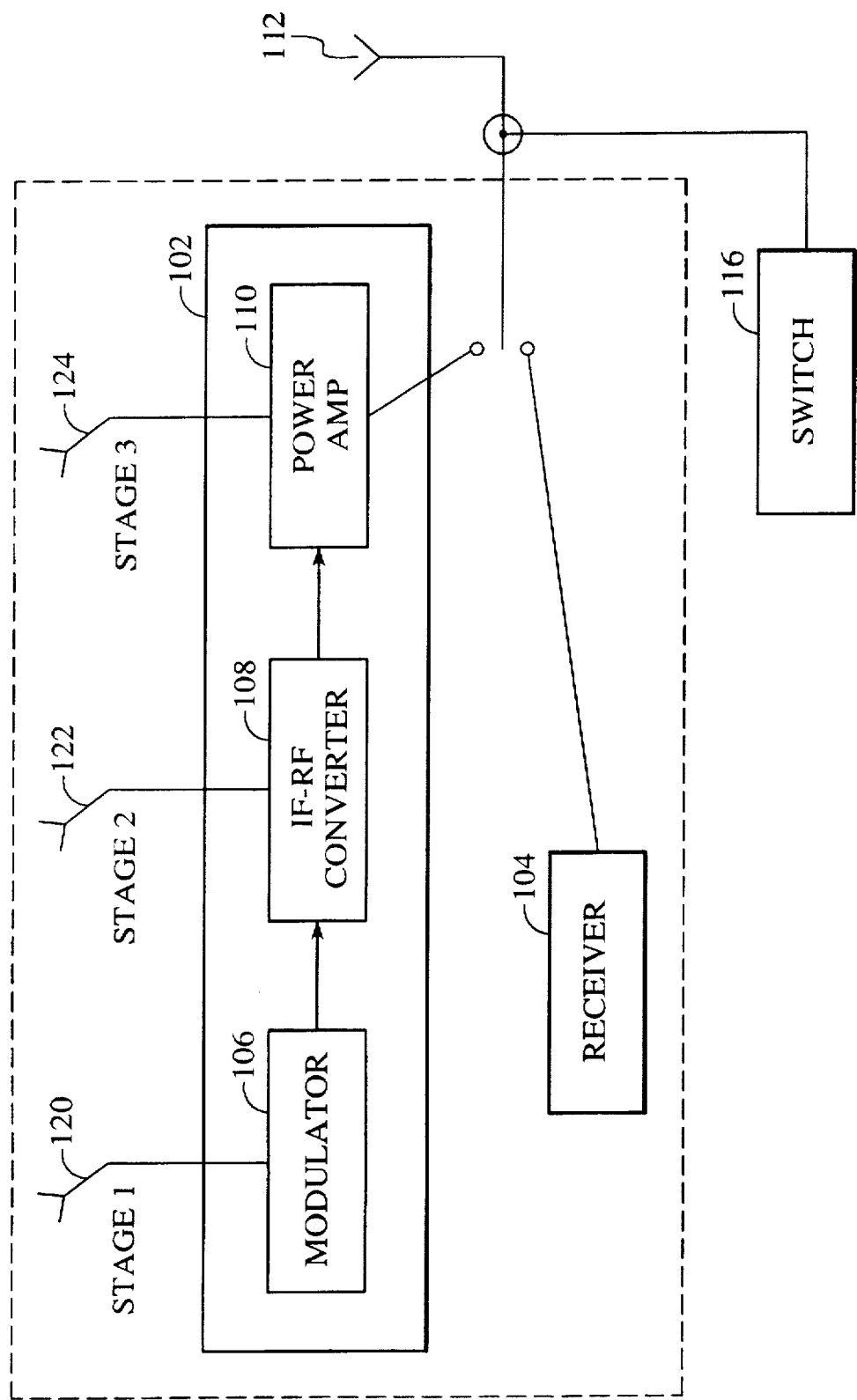
FIG. 2 is a block diagram of a typical radio utilized in a wireless local area network (WLAN) environment.

FIG. 2 is a block diagram of a radio 100 which can be utilized in a Wireless Local Area Network (WLAN). Such a radio 100 typically includes a transmitter 102 and a receiver 104. The transmitter typically includes three stages, a modulator stage 106 (stage 1), which is coupled to an intermediate frequency-radio frequency converter stage 108 (stage 2). The converter 108 in turn is coupled to a power amplifier stage 110 (stage 3). The radio 100 also includes a receiver 104. An antenna 112 is alternately coupled to the power amplifier 110 of the transmitter 102 for transmission and the receiver 104 for reception under control of switch 116.

In a typical WLAN system the different sections of the transmitter 102 stages (modulator 106, converter 108 and power amplifier 110) are turned on and off in a sequential manner via ports 120–124, respectively. To satisfy FCC requirements, a timing sequence is required for turning on the various sections of the radio 100 before transmitting data and turning off the various stages of radio before receiving data.

It is known that if all of the stages of the radio transmitters are turned on at the same time, the signal entering the power amplifier would not be stable and would not be settled out and as a result frequencies and amplitudes outside of the FCC-mandated spectral power density envelope would be created. This effect is often labeled as "splatter" or spurious emissions. This splatter would be in violation of FCC rules. Accordingly, there are limits of the frequency and power spectrum uses for the radio when utilized in a WLAN environment.

Accordingly, a staged power ramp up and power ramp down of the radio 100 is required to ensure that the radio 100 operates within FCC parameters. There is no plan to establish a standard radio power ramp-up and ramp-down interface signalling specification for the 802.11 WLAN standard. Accordingly, the various radio implementations utilized in a WLAN environment have different types of timing sequences for the ramp up and ramp down operations.

Therefore, conventional WLAN systems inbclude radios with radio control functions that generate ramp-up and ramp-down sequences and timing that are designed for that particular WLAN and its radio. Accordingly, a particular radio control function that has been designed for one WLAN cannot be utilized in another WLAN system. What is needed therefore is an apparatus and method allowing for a radio control function to be utilized in a variety of WLAN systems containing a variety of radio implementations.

Figure 3:
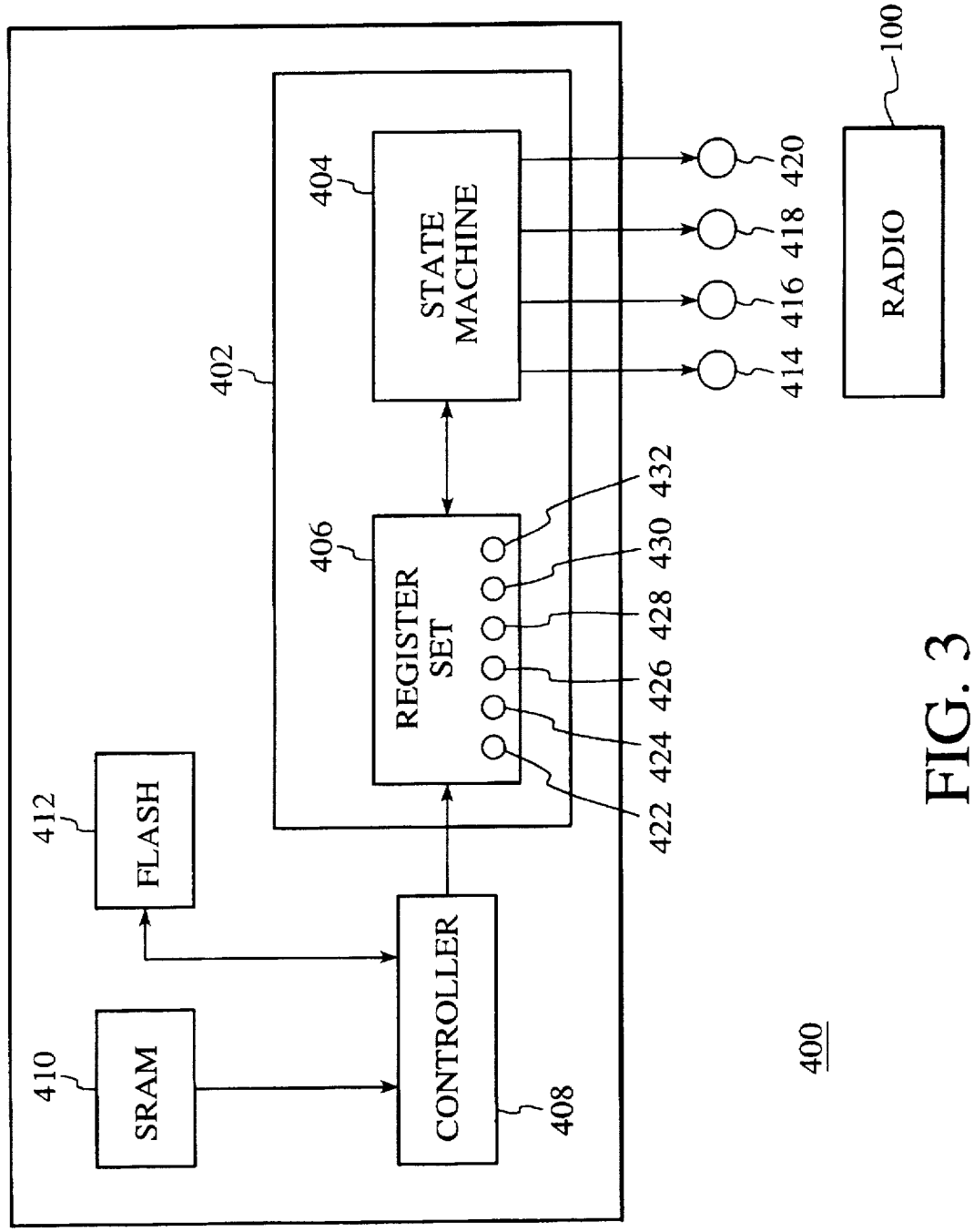
FIG. 3 is a block diagram of a media access controller in accordance with the present invention.

In a preferred embodiment, the present invention is directed to performing a power ramp up and ramp down that allows for various radio implementations to be utilized in a WLAN environment. This is accomplished through use of a MAC device that provides configurable control signals to the transmitter of a radio that will allow for the MAC's adaptability to a particular radio implementation and its WLAN. To more particularly describe the present invention, refer now to FIG. 3 which shows a block diagram of a media access controller 400 which includes the configurable signals which can be utilized in a WLAN system.

The MAC device 400 includes interface unit 402 which includes a state machine 404 (preferably hardwired) which applies signals to the radio 100. One of ordinary skill in the art recognizes the MAC device 400 performs a variety of functions. The present invention is directed to flexibility of the ramp up and ramp down function of the radio, hence only those portions of the MAC device 400 will be discussed hereinbelow.

The radio interface unit 402 also includes a register set 406 which is coupled to a state machine 404. The register set includes six registers 422, 424, 426, 428, 430, and 432. Registers 422, 424, 426, 428 are called TAGP1, TGAP2, TGAP3, and TGAP4, respectfully, and registers 430 and 432 are called txpepol and txmodpol, respectfully. The MAC device 400 also includes a controller 408 which is also coupled to the interface unit 402. The controller 408 is typically a 80188 microcontroller, manufactured by Advanced Micro Devices, Inc. or Intel Corporation. The controller 408 in turn is coupled to a static random access memory 410 and a flash memory 412.

The MAC device 400 allows for the programming of the register set 406, through the controller 408. In a preferred embodiment, the controller 408 will modify the instructions in the register set responsive to user programmable code within the flash memory 412. Also in a preferred embodiment, this MAC device 400 includes a plurality of control pins 414, 416, 418 and 420 coupled to the state machine 404 which are responsive to the bits in the register set. The pins are configurable to allow for programmability of the ramp up and ramp down time of the stages of the radio 100 and will also allow for programming of the polarity to prevent the radio from inappropriately entering a default inactive state. To more fully understand the operation of the present invention, refer to the discussion below.

USER PROGRAMMABILITY

Figure 4:
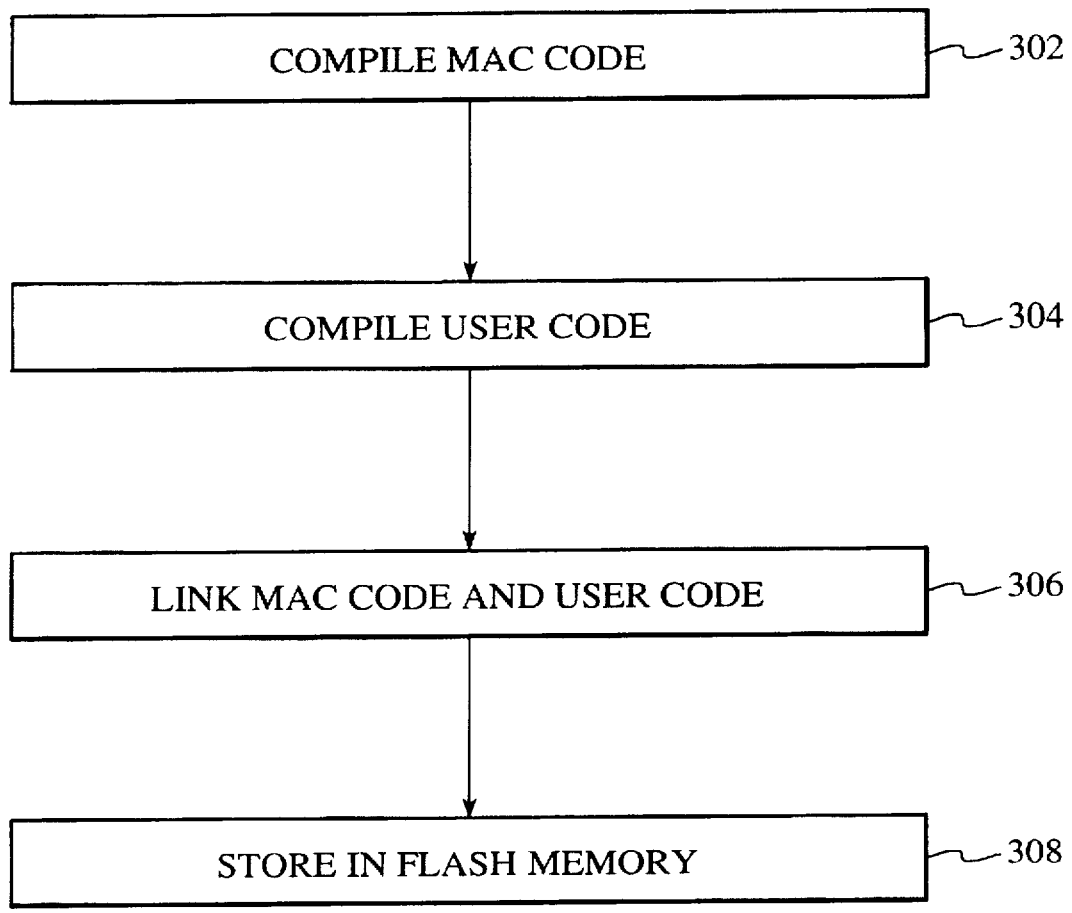
FIG. 4 is a flow chart of the programming of the MAC device for providing the flexible ramp up and ramp down of the present invention.

An apparatus and method in accordance with the present invention allows for user programmability. Referring now to FIG. 4, what is shown is a flow chart showing one implementation of this user programmability. The MAC protocol is compiled, via step 302. The compiled code is initially provided to a user on a medium, such as a floppy disk or the like, via step 302. The compiled MAC code has hooks therewithin that allow the user to write user code to be linked therewith. The user then compiles a program, via step 304 to provide the programmability that the user's compiled code desires. The user and the compiled MAC code are linked, via step 306 and thereafter stored in the flash memory via step

308. Referring back to FIG. 3, as aforementioned the controller 408 will modify the instructions in the register set responsive to user code within the flash memory 412 to cause the state machine 404 which is responsive to the bits in the register set, to provide the appropriate signals to the radio 100.

Although this user programmability has been discussed in terms of a microcontroller firmware application, one of ordinary skill in the art recognizes that this system could be implemented directly in hardware or software and that use would be within the spirit and scope of the present invention. In addition, although the present invention is described in terms of the program stored in the flash memory, one of ordinary skill in the art recognizes that a variety of types of memories can be utilized to store the program used to configure the radio and their use would be within the spirit and scope of the present invention.

Referring back to FIG. 3, in order to properly perform the power-up and power-down sequences for various radios, the MAC device 400 provides these four configurable transmitter control pins 414, 416, 418 and 420. These pins are Transmit Command Signal (TXCMD), Complementary Transmit Command Signal (TXCMDJ), Complementary Transmit Power Enable (TXPEJ), and Complementary Transmitter Modulator Enable (TXMODJ). Assertion of each transmitter control pin turns on a successive stage of the transmitter unit of the radio 100, and deassertion of each transmitter control pin turns off a stage of the transmitter unit of the radio 100.

Figure 5:
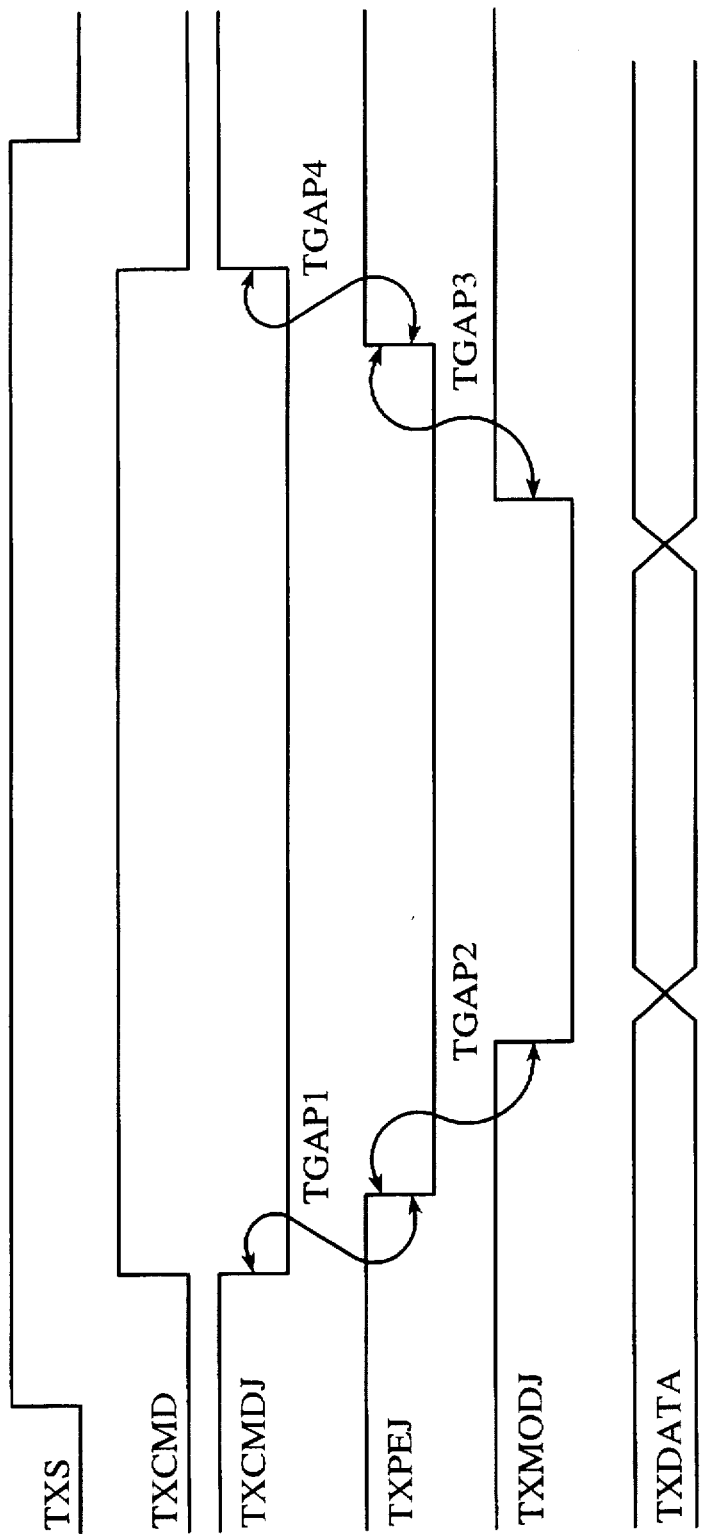
FIG. 5 are timing diagrams of the various signals utilized for providing the ramp up and ramp down signals.

The timing relationships among the four signals are configurable in the following manner: four register locations contain timing control values. The four register locations are labeled TGAP1, TGAP2, TGAP3 and TGAP4. Referring now to FIG. 5 which is a timing diagram of the various signals utilized for providing the ramp up and ramp down signals. TGAP1 defines the time between TXCMD/TXCMDJ assertion and TXPEJ assertion. TGAP2 defines the time between TXPEJ assertion and TXMODJ assertion. TGAP3 defines TXMODJ deassertion to TXPEJ deassertion. TGAP4 defines TXPEJ deassertion to TXCMD/TXCMDJ deassertion.

|       | Related Pins       |                        | TX Power |
|-------|--------------------|------------------------|----------|
| TGAP1 | TXCMD assertion    | → TXPEJ assertion      | on       |
| TGAP1 | TXCMDJ assertion   | → TXPEJ assertion      | on       |
| TGAP2 | TXPEJ assertion    | → TXMODJ assertion     | on       |
| TGAP3 | TXMODJ deassertion | → TXPEJ deassertion    | off      |
| TGAP4 | TXPEJ deassertion  | → TXCMD deassertion    | off      |
| TGAP4 | TXPEJ deassertion  | → TXCMDJ deassertion   | off      |

Once again in a preferred embodiment, the granularity of TGAP1, TGAP2, TGAP3, and TGAP4 is bit times, where a bit is defined as the smallest digital data unit passed between the radio and the controller. The range of configurability in the preferred implementation is 0 to 15 bit times. It should be understood that although the range of configurability in the preferred implementation is 0 to 15 bit times, one of ordinary skill in the art would recognize that these bit times may vary, and those variances would be within the spirit and scope of the present invention. Therefore, the preferred implementation can control the power ramping of a radio with as many as three different signal processing stages whose functions may be started/stopped within 1 bit time of each other or as far apart as 15 bit times from each other. Power ramp staging of this sort allows a typical radio implementation to achieve minimal spectral splatter and smooth in-band spectral density curves during the power ramp-on and power ramp-off times.

Referring back to FIG. 2, each of the different stages 106–110 of the radio 100 may require a different signal polarity to enable the function of that stage. To accommodate the many different possible active high or active low combinations, all control pins' active states are configurable. For instance, TXPEJ can be made to signal an active high indication by setting the txpepol register bit, and TXMODJ can be made to signal an active high indication by setting the txmodpol register pin. The chart below indicates the programmability of the TXPEJ and TXMODJ pins in a preferred embodiment.

| txpepol | txmodpol | TXPEJ       | TXMODJ      |
|---------|----------|-------------|-------------|
| 0       | 0        | active low  | active low  |
| 0       | 1        | active low  | active high |
| 1       | 0        | active high | active low  |
| 1       | 1        | active high | active high |

POLARITY PROGRAMMABILITY

In the preferred embodiment of the present invention, the TXCMD and TXCMDJ signals are both available at all times—i.e. instead of providing a single signal that has programmable polarity. This is necessary in order to prevent a spurious transmission between the time when the system initially powers up and when the signal polarity bit is modified from its default—i.e. if only a TXCMDJ pin were available, and a radio implementation required a TXCMD control signal, then the default inactive state of the TXCMDJ pin (i.e. HIGH) would represent the active state for the radio. This condition would result in a spurious transmission beginning at system power-up time and continuing until the default state of TXCMDJ could be modified.

EXAMPLE OF POWER ON AND POWER OFF FLOW

The radio 100 as has been before mentioned has three different transmission stages that require active-low control inputs to activate. The signals are named: STAGE1DIS, STAGE2DIS, and STAGE3DIS. The power-on sequence order is to first enable STAGE1, then STAGE2 and then STAGE3. The power-off sequence order is to first disable STAGE3, then STAGE2 and finally, STAGE1. In one embodiment, while power is ramping on, the radio specifies that the time between STAGE1 becoming enabled and STAGE2 becoming enabled is 2 bit times, and the time between enabling STAGE2 and STAGE3 is 3 bit times. While power is ramping down, the specified time between disabling of STAGE3 and STAGE2 is 15 bit times and the required time between STAGE2 and STAGE1 is 10 bit times. In order to meet the above specifications, STAGE1DIS must be connected to TXCMDJ, STAGE2DIS must be connected to TXPEJ, and STAGE3DIS must be connected to TXMODJ. Also, to create the correct polarity, the txpepol register bit and the txmodpol register bits must be reset. Accordingly, TGAP1, TGAP2, TGAP3 and TGAP4 are programmed to 2 bit times, 3 bit times, 15 bit times, and 10 bit times respectively.

When the controller issues a transmit command, the TXCMDJ signal is asserted low. TXCMDJ low assertion is followed by the assertion to TXPEJ 2 bit times later. 3 bit times after the assertion of TXPEJ, TXMODJ is asserted low. Finally, the controller will send data to the radio following the assertion of TXMODJ.

After the last data is transmitted, TXMODJ is deasserted followed by the deassertion of TXPEJ 15 bit times later. 10 bit times after the deassertion of TXPEJ, TXCMDJ is deasserted, concluding the transmission.

Although the present invention has been described in accordance with the embodiments shown, one of ordinary skill in the art will recognize that there could be variations to the embodiment and those variations would be within the spirit and scope of the present invention.

It should be understood that although specific transmit control pins and register locations were disclosed, many types of control pins and register locations could be utilized and their use would be within the spirit and scope of the present invention.

In addition, it is readily recognized that although a specific number of control pins is disclosed, the number of pins utilized to provide the programmability can be any number and their use would be within the spirit and scope of the present invention.

Accordingly, many modifications may be made by one of ordinary skill without departing from the spirit and scope of the present invention, the scope of which is defined solely by the following claims.

We claim:

1. A media access control device for providing configurable ramp-up and ramp-down control signals to a radio, the radio including a transmitter that includes a plurality of stages that are turned-on and turned-off in a particular timing sequence in accordance with a particular radio implementation, the media access control device comprising:

a plurality of registers for storing a set of user instructions;

a plurality of transmitter control pins responsive to the plurality of registers for applying the configurable ramp-up and ramp-down control signals to plurality of stages in the transmitter, wherein the ramp-up and ramp-down control signals control the timing sequence required for turning on the plurality of stages before transmitting data and turning off the plurality of stages before receiving data; and a controller coupled to the plurality of registers for modifying the instructions in the register set so that the media access control device is adaptable to a plurality of different radio implementations.

2. A media access control device as in claim 1 wherein the ramp up and ramp down control signals are configurable to control the timing sequence of the plurality of stages to prevent the radio from inappropriately entering into an active state.

3. A media access control device as in claim 2 further including a state machine coupled between the plurality of registers and the plurality of transmitter control pins.

4. A media access control device as in claim 3 wherein the plurality of stages include a modulator stage, an intermediate frequency converter stage, and a power amplifier stage.

5. The media access control device of claim 4 in which the plurality of transmitter control pins comprises four transmitter control pins.

6. The media access control device of claim 5 in which the four transmitter control pins comprise a Transmit Command Signal (TXCMD), Complementary Transmit Command Signal (TXCMDJ), Complementary Transmit Power Enable (TXPEJ), and Complementary Transmit Modulator Enable (TXMODJ).

7. The media access control device of claim 6 in which the plurality of registers comprise six register locations.

8. The media access control device of claim 7 in which the plurality of registers comprise TGAP1, TGAP2, TGAP3 and TGAP4, in which TGAP1 defines a time between TXCMD/TXCMDJ assertion and TXPEJ assertion; TGAP2 defines time between TXPEJ assertion and TXMODJ assertion; TGAP3 defines a time between TXMODJ deassertion and TXPEJ deassertion; and TGAP4 defines TXPEJ deassertion and TXCMD/TXCMDJ deassertion.

9. The media access control device of claim 8 in which the plurality of registers include a granularity which is defined in bit times.

10. The media access control device of claim 5 wherein the range of configurability of each of the plurality of registers may be a plurality of bit times.

11. The media access control device of claim 10 wherein the range of configurability of each of the plurality of registers is 0–15 bit times of the plurality of registers.

12. A method for enabling a media access control device to provide configurable ramp-up and ramp-down control signals to a radio, the radio including a transmitter that includes a plurality of stages that are turned-on and turned-off in a particular timing sequence in accordance with a particular radio implementation, the method comprising the steps of:

providing a plurality of registers for storing a set of user instructions;

applying the configurable ramp-up and ramp-down control signals to plurality of stages in the transmitter through a plurality of transmitter control pins in response to the instructions in the plurality of registers, wherein the ramp-up and ramp-down control signals control the timing sequence required for turning on the plurality of stages before transmitting data and turning off the plurality of stages before receiving data; and modifying the instructions in the register set with a controller so that the media access control devices is adaptable to a plurality of different radio implementations.

13. The method of claim 12 further including the step of configuring the ramp up and ramp down control signals such that the timing sequence of the plurality of stages prevents the radio from inappropriately entering into an active state.

14. The method of claim 13 further including the step of coupling a state machine between the plurality of registers and the plurality of transmitter control pins.

15. The method of claim 14 further including the step of providing the plurality of stages with a modulator stage, an intermediate frequency converter stage, and a power amplifier stage.

* * * * *